(12) United States Patent
Kim et al.

(10) Patent No.: US 9,450,196 B2
(45) Date of Patent: Sep. 20, 2016

(54) ORGANIC LIGHT EMITTING DIODE DISPLAY DEVICE AND METHOD OF FABRICATING THE SAME

(71) Applicant: LG DISPLAY CO., LTD., Seoul (KR)

(72) Inventors: Ho-Jin Kim, Goyang-si (KR); Yong-Chul Kim, Paju-si (KR); Jin-Hyun Jung, Busan (KR); Sun-Ju Lee, Seongnam-si (KR); Ji Ho Ryu, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 46 days.

(21) Appl. No.: 14/263,484

(22) Filed: Apr. 28, 2014

(65) Prior Publication Data

US 2014/0319496 A1    Oct. 30, 2014

(30) Foreign Application Priority Data

Apr. 30, 2013 (KR) ........................ 10-2013-0048680

(51) Int. Cl.
*H01L 29/08* (2006.01)
*H01L 51/00* (2006.01)
*H01L 27/32* (2006.01)

(52) U.S. Cl.
CPC ....... *H01L 51/0097* (2013.01); *H01L 27/3276* (2013.01); *H01L 27/3288* (2013.01); *H01L 2251/5338* (2013.01); *Y02E 10/549* (2013.01)

(58) Field of Classification Search
CPC .. H01L 27/32–27/326; H01L 51/50–51/5012; H01L 51/525–51/5287; H01L 2227/32–2227/326; H01L 2251/5323–2251/5361; H01L 2924/12044
See application file for complete search history.

(56) References Cited

U.S. PATENT DOCUMENTS

| | | | |
|---|---|---|---|
| 6,201,346 B1* | 3/2001 | Kusaka | H01L 27/3288 313/504 |
| 6,633,134 B1* | 10/2003 | Kondo et al. | 315/169.3 |
| 2003/0052584 A1* | 3/2003 | Matsui | F21K 9/00 313/24 |
| 2007/0263164 A1* | 11/2007 | Kumagai | H01L 27/3246 349/156 |
| 2011/0272683 A1* | 11/2011 | Kosuge et al. | 257/40 |
| 2012/0155055 A1* | 6/2012 | Kang et al. | 361/820 |

FOREIGN PATENT DOCUMENTS

TW    200802842 A    1/2008

OTHER PUBLICATIONS

Taiwanese Office Action with English translation dated Dec. 25, 2015 in Taiwanese Patent Application No. 103114411 (8 pages total).

* cited by examiner

*Primary Examiner* — Cuong B Nguyen
(74) *Attorney, Agent, or Firm* — Dentons US LLP

(57) ABSTRACT

An organic light emitting diode display device includes a first substrate; a conductive line formed on a first surface of the first substrate; an organic light emitting diode and an encapsulation layer on the conductive line; a second substrate on the encapsulation layer; a conductive pad connected to the conductive line and arranged in a through hole passing through the first substrate; and a driving circuit unit on a second surface opposite the first surface of the first substrate and connected to the conductive pad.

8 Claims, 5 Drawing Sheets

ORGANIC LIGHT EMITTING DIODE DISPLAY DEVICE AND METHOD OF FABRICATING THE SAME

This application claims the priority benefit of Korean Patent Application No. 10-2013-0048680, filed in Korea on Apr. 30, 2013, which is hereby incorporated by reference for all purposes in its entirety.

BACKGROUND OF THE INVENTION

1. Field of the Invention

The present disclosure relates to an organic light emitting diode display device and a method of fabricating the same. More particularly, the present disclosure relates to an organic light emitting diode display device including a flexible substrate and a method of fabricating the same.

2. Discussion of the Related Art

With the increasing use of portable electronic devices such as tablet PCs and cellular phones, the markets for the most advanced info-communications electronic devices is also steadily increasing. Display devices having light weight and low power consumption have been pursued as devices for displaying information of info-communications electronic devices. Flat panel display (FPD) devices such as liquid crystal display (LCD) devices and organic electroluminescent display (OELD) devices have replaced cathode ray tube (CRT) and have drawn attention. The organic light emitting diode display devices may be referred to as organic electroluminescent display devices. The organic light emitting diode display devices are more advantageous than the liquid crystal display devices in color reproduction, power consumption, response time, and so on. In addition, since the organic light emitting diode display devices are self-luminous, the organic light emitting diode display devices have high contrast ratio, a thin profile and wide viewing angles.

An organic light emitting diode display device includes a display area and a non-display area surrounding the display area regardless of a type of a substrate such as a glass substrate or a flexible substrate to be bent like a liquid crystal display device. Dummy pixels may be formed in the non-display area and may include various elements for driving.

Specially, conductive pads and pad lines are disposed in the non-display area. The conductive pads are a sort of electrodes and are formed at ends of gate and data lines. The gate and data lines are connected to a driving circuit unit through the pads. In addition, the pad lines connect the pads and the driving circuit unit.

Since the conductive pads and the pad lines for connecting the driving circuit unit are formed in the non-display area, a bezel increases. The bezel is an area where an image is not displayed and a frame is formed. The bezel may be the same as or larger than the non-display area. As the bezel increases, the design sensitivity of the display decreases, and a size of the organic light emitting diode display device also increases.

SUMMARY OF THE INVENTION

The present disclosure is directed to an organic light emitting diode display device that substantially obviates one or more of the problems due to limitations and disadvantages of the related art.

An advantage of the present invention is to provide an organic light emitting diode display device that minimizes the bezel.

In one aspect, an organic light emitting diode display device includes a first substrate; a conductive line formed on a first surface of the first substrate; an organic light emitting diode and an encapsulation layer on the conductive line; a second substrate on the encapsulation layer; a conductive pad connected to the conductive line and arranged in a through hole passing through the first substrate; and a driving circuit unit on a second surface opposite the first surface of the first substrate and connected to the conductive pad.

In another aspect, a method of fabricating an organic light emitting diode display device includes forming a first substrate on a base substrate; forming a through hole in the first substrate and forming a conductive pad in the through hole; forming a conductive line on a first surface of the first substrate, wherein a first end of the conductive line is connected to the conductive pad; forming an organic light emitting diode and an encapsulation layer on the conductive line; forming a second substrate over the encapsulation layer; separating the base substrate from the first substrate by irradiating a laser on the base substrate; and forming a driving circuit unit on second surface of the first substrate, wherein the driving circuit unit is connected to the conductive pad.

It is to be understood that both the foregoing general description and the following detailed description are exemplary and explanatory and are intended to provide exemplary embodiments of the invention as claimed.

BRIEF DESCRIPTION OF THE DRAWINGS

The accompanying drawings are included to provide a further understanding of the invention and are incorporated in and constitute a part of this specification. The drawings illustrate exemplary embodiments of the invention and together with the description serve to explain the principles of the invention. In the drawings.

DETAILED DESCRIPTION OF THE ILLUSTRATED EMBODIMENTS

Reference will be made in detail to exemplary embodiments of the present invention, examples of which are illustrated in the accompanying drawings.

Figure 1:
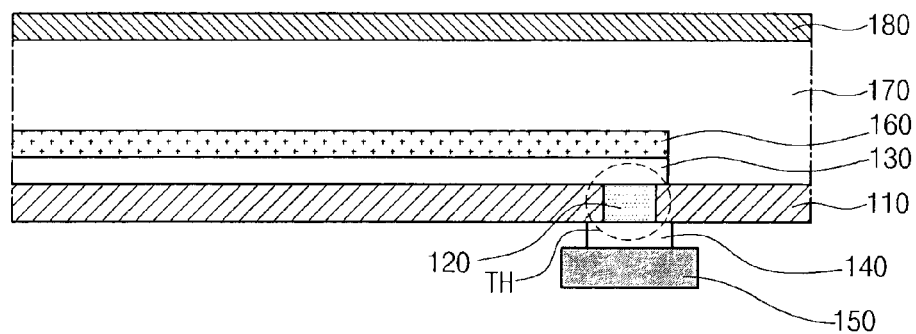
FIG. 1 is a cross-sectional view illustrating an organic light emitting diode display device according to an embodiment of the invention.

FIG. 1 is a cross-sectional view illustrating an organic light emitting diode display device according to an embodiment of the invention.

In FIG. 1, the organic light emitting diode display device according to an embodiment of the invention includes a first substrate 110, a through hole TH, a conductive pad 120, a conductive line 130, a conductive film 140, a driving circuit unit 150, an organic light emitting diode 160, an encapsulation layer 170 and a second substrate 180.

The first substrate 110 may be a flexible, ductile substrate, which is able to be bent, such that the conductive pad 120 is formed in the first substrate 110. The first substrate 110 may include an organic material selected from a group including polyethersulfone (PES), polyarylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), cellulose acetate propionate (CAP), and so on. The second substrate 180 may be also formed of a material having a high ductility like the first substrate 110.

The conductive line 130, the organic light emitting diode 160, the encapsulation layer 170 and the second substrate 180 are sequentially formed on a first surface of the first substrate 110. Namely, the conductive line 130 is formed on the first surface of the first substrate 110, the organic light emitting diode 160 is formed on the conductive line 130, the encapsulation layer 170 is formed on the organic light emitting diode 160, and the second substrate 180 is formed on the encapsulation layer 170.

The conductive line 130 may include at least one of a gate line, a data line and a power supply line crossing one anther to define a pixel. In addition, the conductive line 130 may include a power supply line adjacent to the data line. Accordingly, a plurality of conductive lines 130 may be formed at a boundary line of each pixel.

Moreover, the conductive line 130 may be connected to the driving circuit unit 150. The driving circuit unit 150 connected to the gate line may be a gate driving circuit unit. The driving circuit unit 150 connected to the data line may be a data driving circuit unit. The driving circuit unit 150 connected to the power supply line may be a power supply driving circuit unit.

In the meantime, the through hole TH passing through the first substrate 110 is formed in the first substrate 110, and the conductive pad 120 is formed in the through hole TH. The conductive pad 120 is connected to the conductive line 130. That is, a plurality of through holes TH are formed in the first substrate 110 overlapping one end of a plurality of conductive lines 130, and a plurality of conductive pads 120 are formed in the through holes TH, respectively. Therefore, the conductive lines 130 are connected to the conductive pads 120, respectively.

Additionally, the conductive line 130 and the conductive pad 120 may be formed of a same material. If a material for the conductive line 130 is simultaneously filled in the through hole TH when the conductive line 130 is formed after forming the through hole TH in the first substrate 110, the conductive line 130 and the conductive pad 120 may be formed of the same material.

The driving circuit unit 150 is formed on a second surface of the first substrate 110. The driving circuit unit 150 is connected to the conductive pad 120. Namely, the driving circuit unit 150 is connected to the conductive line 130 through the conductive pad 120, thereby supplying a driving signal to the conductive line 130. If the driving circuit unit 150 is a gate driving circuit unit, the driving circuit unit 150 provides the conductive line 130 with a gate signal. At this time, the conductive line 130 may be a gate line. If the driving circuit unit 150 is a data driving circuit unit, the driving circuit unit 150 provides the conductive line 130 with a data signal. At this time, the conductive line 130 may be a data line.

The driving circuit unit 150 may be directly connected to the conductive pad 120. To directly connect the driving circuit unit 150 with the conductive pad 120, the conductive film 140, which functions as adhesive, may be interposed between the driving circuit unit 150 and the conductive line 130. That is, the conductive film 140 may be attached to the second surface of the first substrate 110 on which the conductive pad 120 is disposed. Accordingly, the driving circuit unit 150 is connected to the conductive pad 120 through the conductive film 140.

The conductive film 140 may be an anisotropic conductive film (ACF). The anisotropic conductive film is a film one side of which electricity flows through. The driving signals supplied to the conductive pads 120 from the driving circuit unit 150 differ from one another. Although the conductive film 140 contacts all the plurality of conductive pads 120, the driving signals output from the driving circuit unit 150 are correctly transmitted to the respective conductive pads 120 through the conductive film 140 without mixing other driving signals transmitted to the conductive pads 120 adjacent thereto because the conductive film 140 transmits the driving signals through one side thereof.

The organic light emitting diode 160 and the encapsulation layer 170 are formed on the conductive line 130. More particularly, the organic light emitting diode 160 may include a first electrode (not shown), a second electrode (not shown) and a light emitting layer (not shown) formed therebetween. An electron and a hole supplied from the first and second electrodes are combined with each other in the light emitting layer to thereby generate exciton, and light is emitted when the exciton transitions to the ground state.

The encapsulation layer 170 is formed on the organic light emitting diode 160. The encapsulation layer 170 may cover a substantially entire surface of the first substrate 110 or most of a surface of the first substrate 110 excluding a part in order to prevent the organic light emitting diode 160 from being damaged. The encapsulation layer 170 may have a multi-layer structure including organic material layers and inorganic material layers which are alternately and repeatedly formed. In addition, since the encapsulation layer 170 functions as a passivation layer as shown in FIG. 1, the encapsulation layer 170 may be formed wider to cover the conductive pad 120 and the conductive line 130. Here, the encapsulation layer 170 may be formed on the first substrate 110 as widely as a minimum width for function of the passivation layer. Accordingly, it is possible to implement a zero bezel or a bezel with a minimum width.

The second substrate 180 is formed on the encapsulation layer 170, and the second substrate 180 functions as protecting the organic light emitting diode display device from the outside like the encapsulation layer 170. Since the first substrate 110 is a ductile substrate to be bent, the second substrate 180 may be formed of the same material as the first substrate 110.

As stated above, the organic light emitting diode display device may have the zero bezel or the bezel with the minimum width. Therefore, when an organic light emitting diode display device having a large-sized panel is implemented by connecting a plurality of small panels, a screen may not be discontinued in bezel areas, and continuity of the screen may be obtained.

Figure 2:
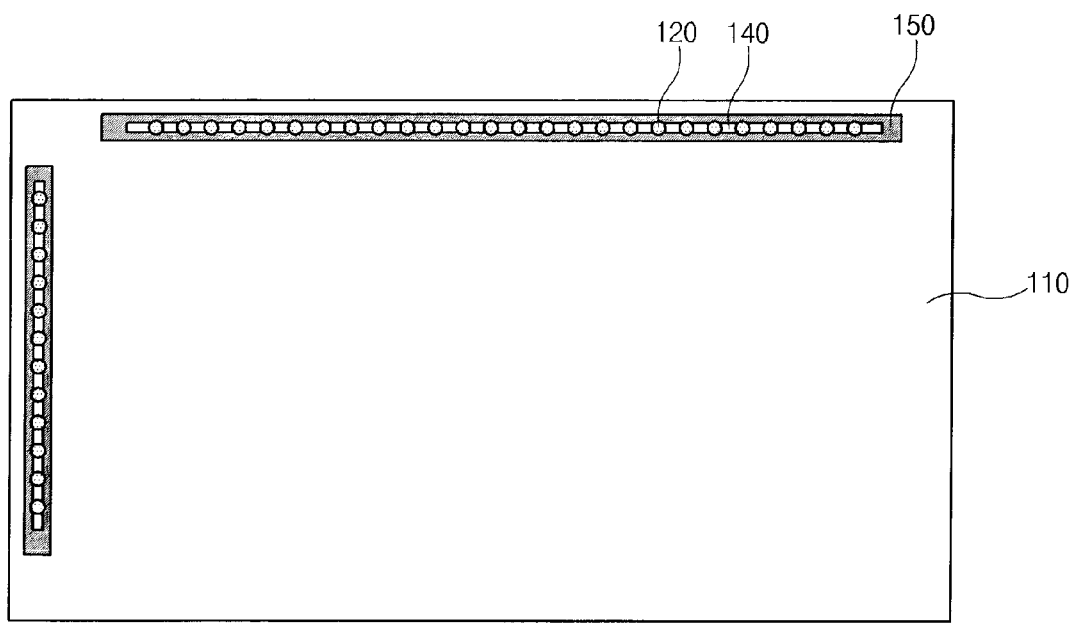
FIG. 2 is a plan view illustrating a rear side of the organic light emitting diode display device according to the embodiment of the invention illustrated in FIG. 1.

FIG. 2 is a plan view illustrating a rear side of the organic light emitting diode display device according to the embodiment of the invention.

In FIG. 2, the conductive pad 120 is formed in the first substrate 110. Here, although the conductive pad 120 is illustrated to have a circular shape, the conductive pad 120 may have various shapes such as a rectangular shape. The conductive film 140 is disposed in an area corresponding to the conductive pad 120, and the driving circuit unit 150 is attached to and directly contacts the conductive film 140. Here, the driving circuit unit 150 may consist of a driving circuit chip, without an additional board, which directly contacts the conductive pad 120.

Since the driving circuit unit 150 is directly connected to the conductive pad 120 formed in the first substrate 110 as mentioned above, the zero bezel may be implemented or the width of the bezel may be minimized.

Figure 3:
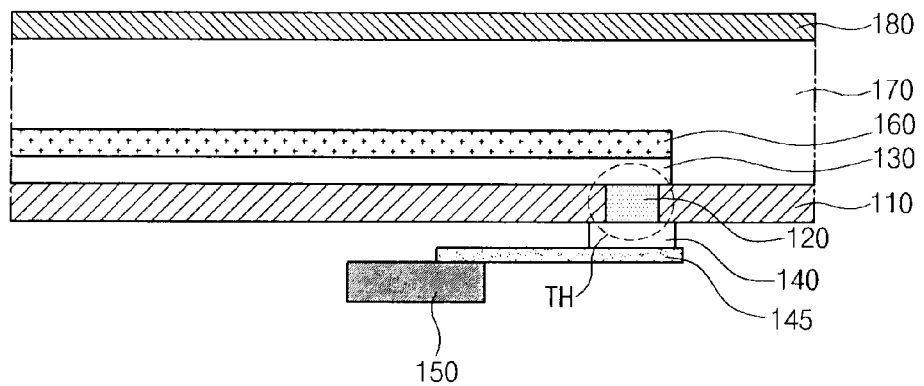
FIG. 3 is a cross-sectional view illustrating an organic light emitting diode display device according to another embodiment of the invention.

FIG. 3 is a cross-sectional view of illustrating an organic light emitting diode display device according to another embodiment of the invention.

In FIG. 3, the organic light emitting diode display device according to another embodiment of the invention includes a first substrate 110, a through hole TH, a conductive pad 120, a conductive line 130, a conductive film 140, a connection film 145, a driving circuit unit 150, an organic light emitting diode 160, an encapsulation layer 170 and a second substrate 180.

The current embodiment further includes the connection film 145 in addition to the elements of the embodiment of FIGS. 1 and 2. The connection film 145 is disposed between the conductive film 140 and the driving circuit unit 150 and connects the conductive film 140 and the driving circuit unit 150. Accordingly, the driving circuit unit 150 is connected to the conductive pad 120 through the connection film 145 and the conductive film 140.

In the current embodiment, the circuit driving unit 150 may be connected by an existing method. According to the existing method, the conductive pad 120 is formed on a first surface of the substrate 110, the connection film 145 is attached to the conductive pad 120 by the conductive film 140, the connection film 145 is bent toward a second surface of the first substrate 110 from the first surface of the first substrate 110, and the driving circuit unit 150 is disposed on the second surface of the first substrate 110.

By the way, in the current embodiment, since the conductive pad 120 is disposed on the second surface of the first substrate 110, the conductive pad 120 may be connected to the driving circuit unit 150 without bending the connection film 145 from the first surface to the second surface of the first substrate 110.

The connection film 145 includes a plurality of lines each corresponding to each conductive pad 120 therein to transmit a driving signal from the driving circuit unit 150 to each conductive pad 120.

Figure 4:
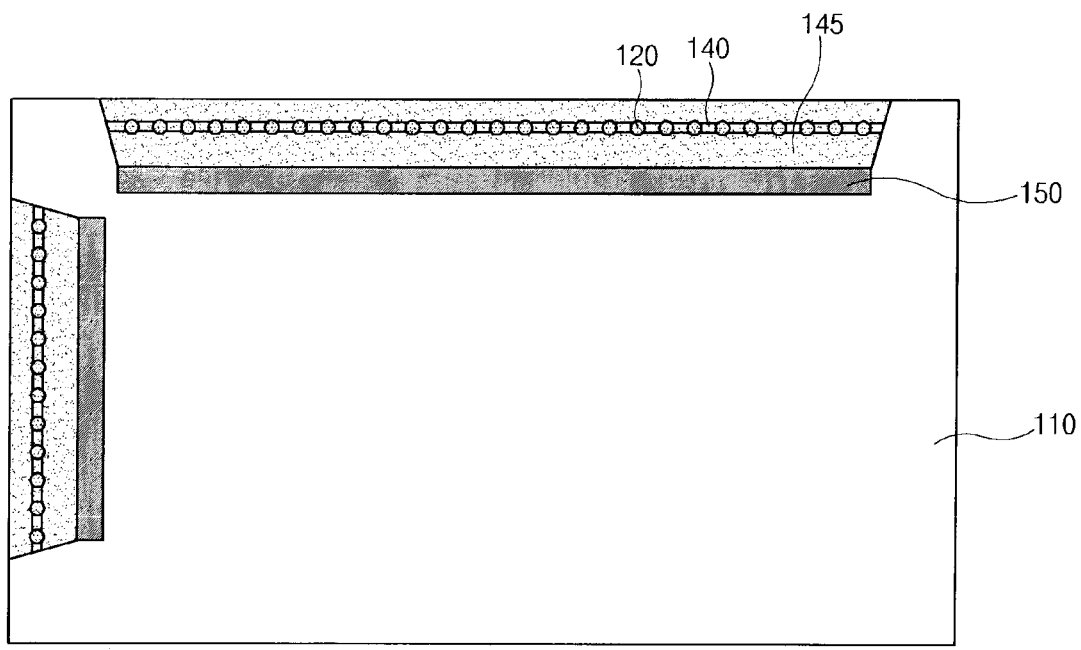
FIG. 4 is a plan view illustrating a rear side of the organic light emitting diode display device according to the embodiment of the invention illustrated in FIG. 3.

FIG. 4 is a plan view of illustrating a rear side of the organic light emitting diode display device according to the embodiment of FIG. 3 of the invention.

In FIG. 4, the conductive pad 120 is formed in the first substrate 110, and one end of the connection film 145, which completely covers the conductive pad 120, is connected to the conductive pad 120 by the conductive film 140 interposed between the conductive pad 120 and the connection film 145. The other end of the connection film 145 is connected to the driving circuit unit 150. The driving circuit unit 150 may consist of a board with a driving circuit chip thereon or a driving circuit chip without a board.

In the current embodiment where the conductive pad 120 and the driving circuit unit 150 are connected by the connection film 145 like the existing method, the conductive pad 120 and a line connected thereto are not formed in a bezel area. Accordingly, the zero bezel may be implemented or the width of the bezel may be minimized.

FIGS. 5A to 5F are cross-sectional views illustrating cross-sections of an organic light emitting diode display device and steps of fabricating the same according to an embodiment of the invention.

Figure 5A:
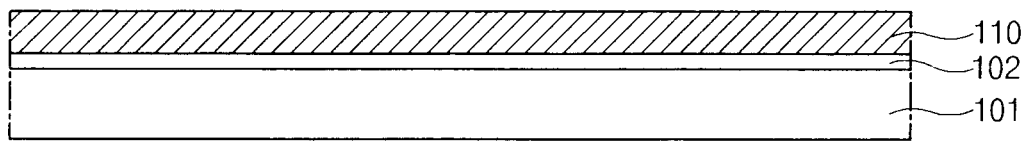
FIGS. 5A to 5F are cross-sectional views illustrating cross-sections of an organic light emitting diode display device in steps of a method of fabricating the same according to an embodiment of the invention.

In FIG. 5A, a sacrificial layer 102 is formed on a base substrate 101, and a first substrate 110 is formed on the sacrificial layer 102. That is, the first substrate 110 is formed on the base substrate 101. Since the first substrate 110 is a flexible, ductile substrate as stated above, it is difficult to form elements such as a conductive line and an organic light emitting diode directly on the first substrate. Therefore, a hard substrate having a higher hardness than the first substrate 110 is needed during processes for forming the elements. The base substrate 101 functions as the hard substrate. The base substrate 101 may be a glass substrate, which is widely used as a substrate for a display device.

In addition, the sacrificial layer 102 may be formed on the base substrate 101. The base substrate 101 may be detached from the first substrate 110 after all the elements are formed later, and at this time, the sacrificial layer 102 functions as a way to separate the base substrate 101 from the first substrate 110.

Figure 5B:
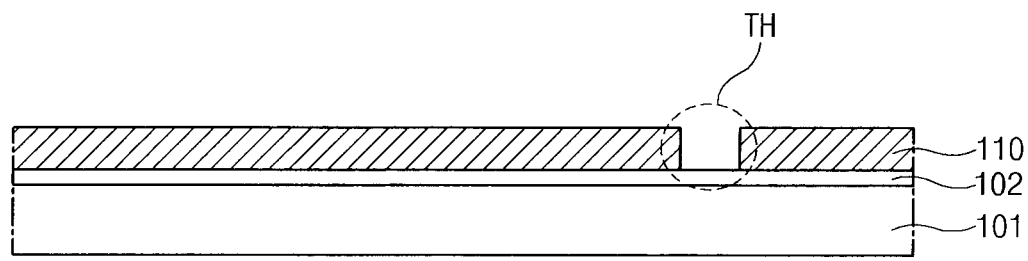

Next, in FIG. 5B, a through hole TH is formed in the first substrate 110. The through hole TH may be formed by various methods such as a photolithography process, laser irradiation, a punch, and so on. Moreover, the through hole TH may be formed by a micro drill.

If the through hole TH is formed by a photolithography process, the first substrate 110 may be formed of polyimide, which is able to be patterned by the photolithography process.

In the case of laser irradiation, a mask with an opening corresponding to a location where the through hole TH is formed is aligned, and then the laser is irradiated to remove a portion of the first substrate 110 in the location, thereby forming the through hole TH.

In the case of using a punch, a portion of the first substrate 110 in the location where the through hole TH is formed is removed by the punch, thereby forming the through hole TH.

In the case of using a micro drill, a portion of the first substrate 110 in the location where the through hole TH is formed is removed by the micro drill, thereby forming the through hole TH.

Figure 5C:
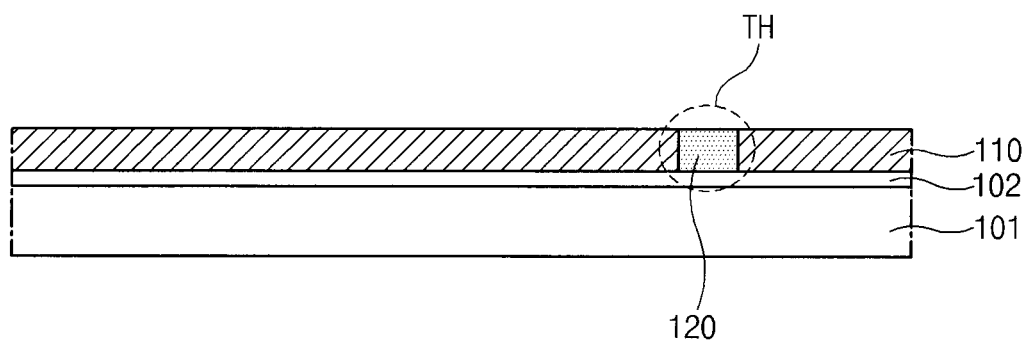

Next, in FIG. 5C, a conductive pad 120 is formed by filling the through hole TH in the first substrate 110 with a conductive material. The conductive pad 120 may be formed by a screen printing method. The conductive pad 120 may be formed of a conductive material such as copper.

First, a printing mask is disposed over a first surface of the first substrate 110 including the through hole TH. Then, the conductive material is placed in an open area of the printing mask, and the conductive material is filled in the through hole TH of the first substrate 110 through the open area of the printing mask by, for example, squeezing the conductive material with a squeezer. Next, the conductive material may be cured through drying and heat-treating processes.

Alternatively, the conductive pad 120 may be formed by a dotting method or an inkjet method.

Figure 5D:
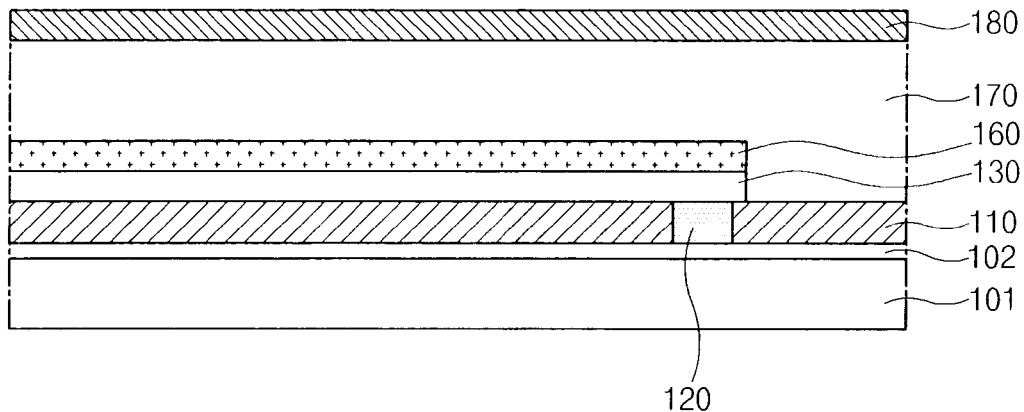

Next, in FIG. 5D, a conductive line 130, an organic light emitting diode 160, an encapsulation layer 170 and a second substrate 180 are sequentially formed on the first substrate 110. The conductive line 130 is connected to the conductive pad 120. If the conductive line 130 is formed right after forming the conductive pad 120, the conductive line 130 and the conductive pad 120 may be formed simultaneously. That is, if the conductive line 130 is formed in the through hole TH after forming the through hole TH, the conductive pad 120 is not needed to be formed separately, and there is an advantage of decreasing the number of processes.

If an insulating layer (not shown) is interposed between the conductive line 130 and the conductive pad 120, the insulating layer should be patterned to expose the conductive pad 120, and the conductive line 130 should be connected to the exposed conductive pad 120.

Figure 5E:
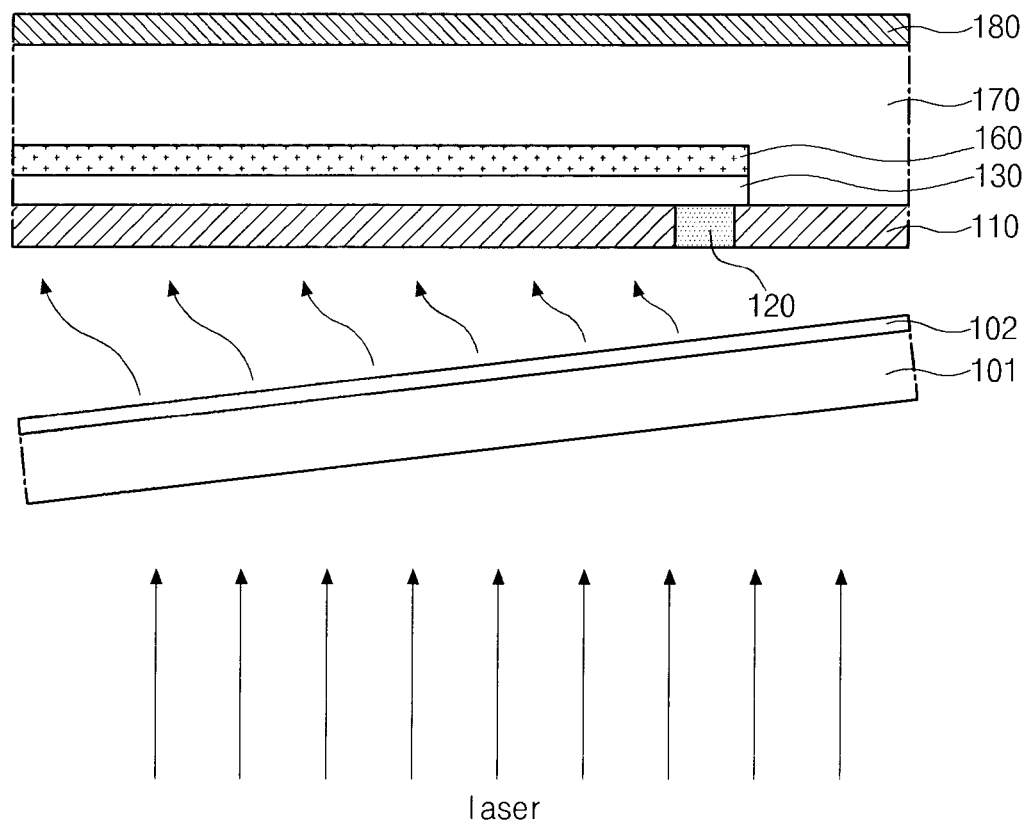

Next, in FIG. 5E, a laser is irradiated on the base substrate 101, and the base substrate 101 is separated from the first substrate 110. At this time, gas is released from the sacrificial layer 102 by laser irradiation, and the base substrate 101 is separated from the first substrate 110.

The sacrificial layer 102 may be formed of amorphous silicon including hydrogen. Thus, when the laser is irradiated, hydrogen gas (H2) is jetted out, and the base substrate 101 and the sacrificial layer 102 are separated from the first substrate 110.

Figure 5F:
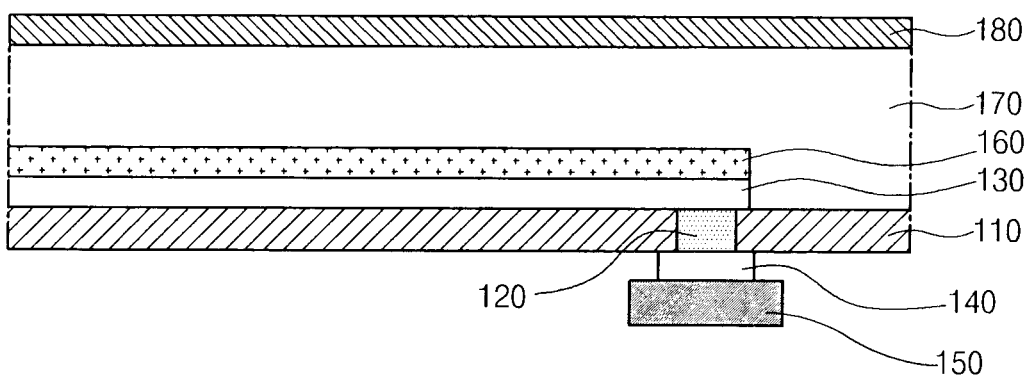

Next, in FIG. 5F, a conductive film 140 is attached to be directly connected to a second surface of the first substrate 110, and a driving circuit unit 150 is attached to the conductive film 140. Namely, the driving circuit unit 150 is formed over the second surface of the first substrate 110 and connected to the conductive pad 120. Additionally, the driving circuit unit 150 is connected to the conductive pad 120 through the conductive film 140.

Although not shown in the figures, a method of fabricating an organic light emitting diode display device according to another embodiment may further include steps of attaching a connection film 145 to the conductive film 140 and then attaching the driving circuit unit 150 to the connection film 145. The connection film 145 connects the conductive film 140 and the driving circuit unit 150. That is, the driving circuit unit 150 is connected to the conductive pad 120 through the connection film 145 and the conductive film 140.

According to the invention, the conductive pad 120 is formed in the substrate, and the bezel is minimized because it is not necessary to form a pad line connecting the conductive pad and the driving circuit unit.

In addition, since the bezel of the organic light emitting diode display device is minimized, a size of the organic light emitting diode display device is decreased while a display area for displaying images is maintained.

Moreover, the organic light emitting diode display device has a minimized bezel or zero bezel, and when an organic light emitting diode display device having a large-sized panel is implemented by connecting a plurality of small panels, continuity of a screen is achieved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
a first substrate having at least one through hole, wherein a thickness of the through hole is the same as a thickness of the first substrate;
a conductive line formed on an upper surface of the first substrate;
an organic light emitting diode and an encapsulation layer each on the conductive line;
a second substrate on the encapsulation layer;
a conductive pad connected to the conductive line and arranged in the at least one through hole passing through the first substrate, wherein a thickness of the conductive pad is the same as the thickness of the first substrate; and
a driving circuit unit on a lower surface opposite the upper surface of the first substrate and connected to the conductive pad via the at least one through hole of the first substrate,
wherein the first substrate is a flexible material,
wherein the conductive line is disposed between the first substrate and a light emitting layer of the organic light emitting diode and the conductive line overlaps the driving circuit unit, and
wherein the encapsulation layer covers a sidewall of one end of the conductive line and a side wall of one end of the organic light emitting diode.

2. The organic light emitting diode display device according to claim 1, wherein the conductive line includes at least one of a gate line, a data line and a power supply line.

3. The organic light emitting diode display device according to claim 1, further comprising a conductive film between the conductive pad and the driving circuit unit, wherein the driving circuit unit is connected to the conductive pad through the conductive film.

4. The organic light emitting diode display device according to claim 3, further comprising a connection film between the conductive film and the driving circuit unit, wherein the driving circuit unit is connected to the conductive pad through the connection film and the conductive film.

5. The organic light emitting diode display device according to claim 1, wherein the conductive pad is formed of a same material as the conductive line.

6. The organic light emitting diode display device of claim 1, wherein one end of the conductive line overlaps the at least one through hole in the first substrate.

7. The organic light emitting diode display device of claim 1, wherein the first substrate is plastic.

8. The organic light emitting diode display device of claim 1, wherein the first substrate is an organic material selected from one of polyethylene terephthalate (PET), polyimide, and polycarbonate (PC).

\* \* \* \* \*